United States Patent [19]

Voss

[11] 4,442,406
[45] Apr. 10, 1984

[54] FREQUENCY MONITOR WITH ADJUSTABLE TOLERANCE

[75] Inventor: Earl W. Voss, Colcord, Okla.

[73] Assignee: Diversified Electronics, Inc., Evansville, Ind.

[21] Appl. No.: 306,756

[22] Filed: Sep. 29, 1981

[51] Int. Cl.³ .................. H03D 3/02; H03L 7/00; H03K 5/22
[52] U.S. Cl. .................. 328/134; 307/526; 307/527; 328/112
[58] Field of Search ............. 328/134, 133, 141; 307/526, 528, 523, 234, 527, 510, 514, 516, 518

[56] References Cited

U.S. PATENT DOCUMENTS

| | | | |
|---|---|---|---|
| 3,200,340 | 8/1965 | Dunne | 307/528 |
| 3,588,710 | 6/1971 | Masters | 328/133 |
| 3,763,317 | 10/1973 | Coleman, Jr. et al. | 328/155 |
| 3,895,293 | 7/1975 | Munz | 307/528 |
| 3,993,984 | 11/1976 | Penrod | 328/134 |
| 4,052,676 | 10/1977 | Crittenden | 328/141 |

Primary Examiner—John S. Heyman
Assistant Examiner—Timothy P. Callahan
Attorney, Agent, or Firm—Robert R. Keegan

[57] ABSTRACT

There is disclosed a frequency monitor circuit, for monitoring AC power frequency for example, in which a gate is provided for a stable oscillator and frequency divider circuit which is responsive to the frequency divided monitored signal and a flip-flop circuit to produce a fixed reference period signal equal to a predetermined number of cycles of the oscillator commencing at the beginning of a full cycle of the monitored signal; a two-stage timer which determines the tolerance for the monitored signal frequency and is adjustable is provided with signals from the monitored signal divider circuit and the fixed reference period circuit and arranged so that the end of the reference period or the end of the divided monitored signal cycle, whichever occurs first, will start the timer. Its output latches a pair of flip-flop circuits acting as decoders which are respectively supplied with the state of the frequency divided monitored signal and the fixed reference period signal. If both have ended and changed state, the monitored signal is determined to be within frequency tolerance; if the frequency divided monitored signal has not changed state the frequency is low; if the fixed reference period signal has not changed state the frequency is high; high and low indicators are provided and a relay driver is operated in response to a within-tolerance condition. A double frequency detector circuit produces an inhibiting signal which resets the low frequency decoder flip-flop and prevents a false low frequency signal for monitored signal frequencies about or more than double the center frequency. One stage of the two stage timer is caused to have a negligible time delay by a signal fed from the out-of-tolerance output of the decoder circuits so that entry into within tolerance condition is more restricted than maintenance of within tolerance condition thus preventing vacillation between the two conditions in borderline cases.

15 Claims, 3 Drawing Figures

FREQUENCY MONITOR WITH ADJUSTABLE TOLERANCE

The present invention relates to frequency monitor electronic circuits and particularly to such circuits adapted to monitor AC power frequencies such as the 60 Hz frequency in the United States and the 50 Hz frequency prevalent in Europe and other places. While this is the most important present application of the present invention the principles of the invention are applicable to frequency monitoring over a very much wider range and to numerous applications.

It will often be desirable to monitor AC power frequency with relatively inexpensive apparatus outside the utility power network. For example this is desirable with respect to locally generated AC power for standby or emergency purposes or where utility power is unavailable. It may be particularly desirable in cogeneration applications where locally generated power from wind generators, from waste heat steam generators, or from private hydroelectric generators is tied into the utility power grid.

Although great numbers of electronic circuits for measuring or monitoring the frequency of an electrical signal have been devised, such circuits do not meet the requirements of an AC power frequency monitor which should be very simple and inexpensive, quite accurate and stable, and highly reliable both from the point of view of detecting out-of-tolerance frequencies and being free from false alarm indications due to waveform distortion or other causes. Another important feature for an AC power frequency monitor is that it be readily adjustable in tolerance from a fraction of one Hz to several Hz to meet the needs of various applications or conditions of use.

In general previous frequency monitors that employed passive filter circuits as a frequency reference for a frequency monitor have not provided performance satisfactory for an AC power frequency monitoring device. On the other hand frequency monitors utilizing stable oscillators such as crystal controlled oscillators have been complicated and expensive and still have not provided all the characteristics needed for an AC frequency monitoring device. When a stable oscillator is utilized in a frequency monitor device the situation lends itself to the use of digital logic circuitry in whole or in part. This permits the comparison of a reference or clock signal with a monitored signal by comparing square waveform versions of the signals to get time or phase relationships. This procedure which is used in the present invention has also been employed in prior art frequency control or frequency monitoring devices; U.S. Pat. No. 3,701,039 to Lange, et al. is an example of the use of digital logic circuits in a frequency control device, but it does not provide the advantages of the present invention.

The present apparatus provides the desired advantages of a frequency monitor for AC power frequencies in a novel manner heretofore not achieved. The device of the present invention allows the user to set the frequency tolerance or band width which is acceptable in a particular application or condition of use. In the preferred embodiment the tolerance is easily set with a single control adjustment to provide upper and lower tolerances equally spaced from the center frequency by an amount measured in Hz or fractions of Hz. The device operates on a full wave of the monitored signal and thus asymmetry between the two half waves of the monitored signal is not misinterpreted as a frequency error. On the other hand in the preferred embodiment each full wave of the monitored signal is compared with the reference so that frequency modulation of the AC signal would be detected even though the average frequency or mid-frequency was at or near the standard reference frequency.

Signal indicator lights are provided to show an out-of-tolerance condition and whether the frequency is high or low. Also relay contacts are provided which open in response to such condition. These and other features of the present apparatus are provided with a relatively simple circuit arrangement utilizing commonly available digital integrated circuit components making it quite inexpensive to produce.

It is an object of the present invention to provide a frequency monitor for AC power frequencies or similar applications employing a stable oscillator and digital logic circuitry which compares a square half-frequency waveform derived from the monitored signal with a periodic waveform generated from the reference frequency oscillator and determines when the periods of the two waveforms differ by a predetermined (but adjustable) time thereby providing an in or out-of-tolerance signal corresponding to a fraction of one Hz or several Hz in frequency.

It is another object of the present invention to provide a frequency monitor apparatus which determines whether a monitored frequency is within a prescribed number of Hz of a center frequency and in which the prescribed number is adjustable from a fraction of one Hz to several Hz.

It is still another object of the present invention to provide a frequency monitor apparatus for determining whether a monitored signal is within a prescribed tolerance of a center frequency and for indicating whether an out-of-tolerance signal is high or low in frequency wherein a nearly double frequency signal is detected and a false "low frequency" signal under these conditions is prevented.

Other objects and advantages of the present invention will be apparent from consideration of the following description in conjunction with the appended drawings in which.

Figure 1:
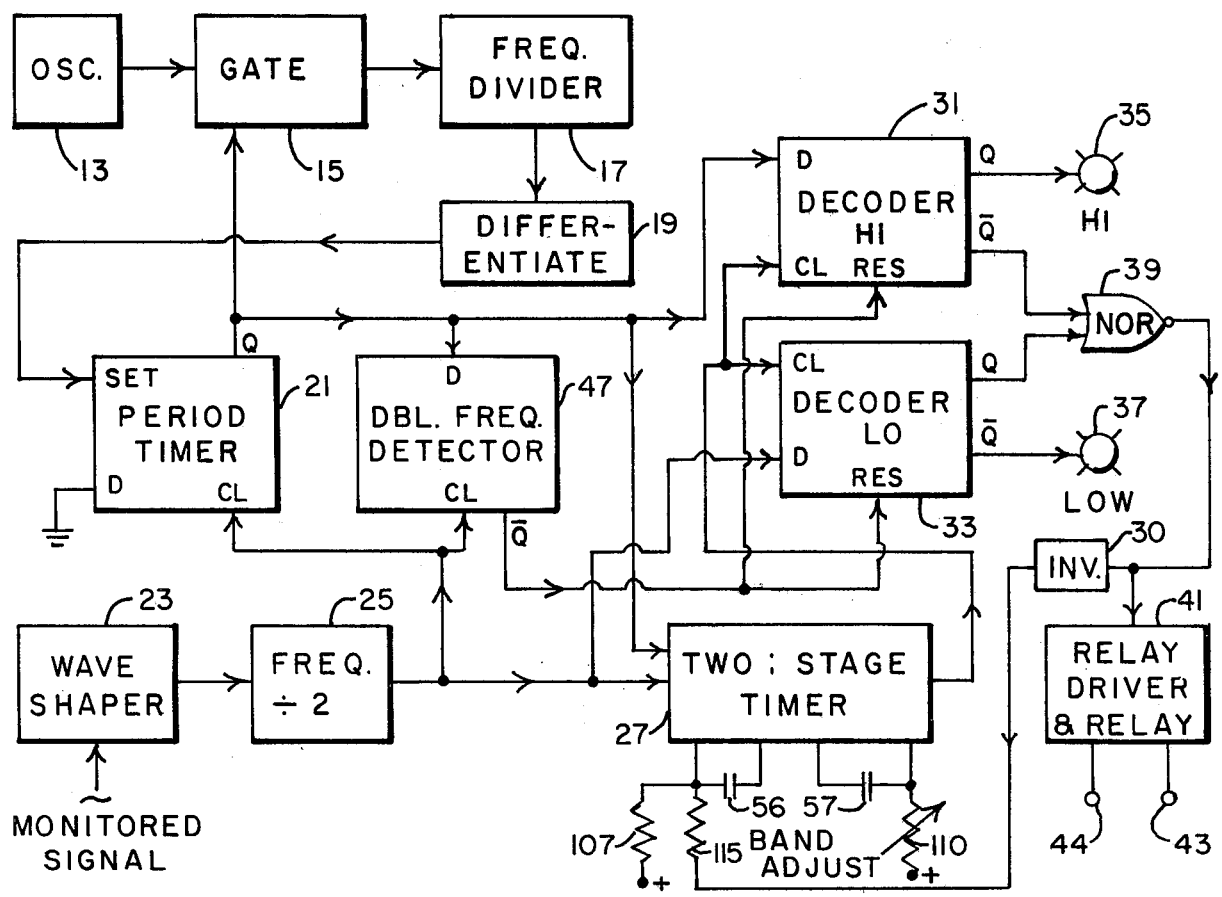
FIG. 1 is a schematic block diagram of a frequency monitor circuit according to the present invention.

Referring now to the drawings and particularly FIG. 1, a crystal oscillator 13 produces a very stable frequency of 3.579545 MHz. A crystal controlled oscillator is utilized in order that the reference frequency it generates is very accurate notwithstanding voltage or temperature variations. Oscillator 13 operates at all times that power is applied.

The reference frequency from oscillator 13 is supplied through a gate 15 to a frequency divider 17. For a 60 Hz monitored frequency, divider 17 divides the 3.579545 MHz output of the oscillator by 59,659 to produce a 60 Hz output. If an AC power frequency of 50 Hz is to be monitored the frequency divider 17 is changed to divide by 71,591. This discussion assumes a 60 Hz frequency.

The incoming AC line voltage or other monitored signal is supplied to wave shaper 23 which includes a low pass filter network and a square wave generator. The square wave from wave shaper 23 is supplied to a frequency divide by two circuit 25. It may be noted that the frequency scale of the frequency monitor apparatus may be changed by changing the frequency divide by two circuit 25 to divide by some multiple of two. For example, AC power is sometimes provided at 400 Hz and this frequency may be monitored by using the 72,591 divider in frequency divider 17 and using a frequency divide by 16 circuit in place of the frequency divide by two circuit 25. Changing the scale in this fashion can often be accomplished merely by changing a connection from one pin to another on a frequency divider or counter IC. The output of frequency divide circuit 25 is provided to the clock input of a period timer circuit 21.

The positive going edge of the waveform from frequency divider 25 clocks a zero in the "Q" output of period timer 21. The output of period timer 21 opens gate 15 to allow the oscillator signal to be fed to the frequency divider 17 and start a reference time period which is equal to 1/60th of one second or 16.66667 ms. At the end of this period frequency divider 17 produces an output pulse which is differentiated by differentiate circuit 19 and supplied to the "set" input of the period timer 21. This causes the "Q" output of period timer 21 to return to a "one" closing gate 15 and cutting off the clock pulses to frequency divider 17. Another reference time period is not started until the next positive going edge of the waveform from frequency divide by two circuit 25 is applied to the clock input of period timer 21 at which time the previously described sequence repeats.

A two-stage timer 27 receives the output of divide by two circuit 25 and also receives the output from period timer 21. Two-stage timer 27 may be two one-shot multi-vibrators connected in tandem or any conventional time delay circuit providing a short delay up to about one millisecond. An adjustable one-shot multi-vibrator is inexpensive and convenient for this purpose but it may be noted that a digital counter or other digital timing device may be substituted for the analog one-shot multi-vibrator.

Two-stage timer 27 is arranged so that an output received from either the period timer 21 of the divide by two circuit 25 will start timer 27. The time period of the first stage of timer 27 primarily is determined by resistor 107 and capacitor 56 and is a relatively short time on the order of 30 microseconds. The end pulse from the first stage of timer 27 triggers the second stage which is a longer period primarily determined by variable resistor 110 and capacitor 57. The time period for the second stage of timer 27 might, for example, be that corresponding to the difference between 60 Hz and 65 Hz or approximately 1.3 milliseconds maximum. The purpose of the first of the two-stage timer is to introduce a very short additional time delay which is operative when a within-tolerance frequency condition exists thereby preventing vacillation between within-tolerance and out-of-tolerance conditions as will be later explained.

The output of two-stage timer 27 goes to the clock (CL) inputs of the decoder hi circuit 31 and the decoder lo circuit 33; this latches the logic levels present at the "D" inputs of the decoder hi 31 and decoder lo 33. Observe that the decoder hi circuit 31 is supplied at input "D" with a signal denoting the end of the reference time period while decoder lo circuit 33 is provided at input "D" with a signal denoting the end of the monitored signal one cycle period. It is these signals which are latched by the output of the two-stage timer 27. It will be recalled that the two-stage timer was started when the first of the two above mentioned periods ended. If upon completion of the timing cycle of the two-stage timer the other period has also ended then both periods would have ended and this condition would be input to the "D" inputs of decoder hi 31 and decoder lo 33 and would be latched by the output of the two-stage timer. For this situation it can be seen that the time periods of the reference period timer and of one cycle period of the monitored signal do not differ by more than the time set on the two-stge timer and thus the frequency of the monitored signal is within the frequency tolerance set.

Consider now the situation where the output from timer 27 latches decoder hi 31 and decoder lo 33 and the inputs to the "D" input are not both indicating that the time period associated with that particular decoder has ended. In other words, one of the two time periods ended to start the two-stage timer 27, and the other time period had not ended at the conclusion of the two-stage timer cycle. This represents a situation where the period of the monitored signal cycle and the reference period differ by more than the two-stage timer time setting and the monitored signal frequency is thus out-of-tolerance. If decoder hi 31 is latched before the termination of the reference period as indicated by a signal from period timer 21 then the reference period is long relative to one cycle of the monitored signal indicating a high, out-of-tolerance frequency. By an arbitrary assignment of polarities the "Q" output of decoder hi 31 causes indicator light 35 to be lit in the condition just described.

In a similar fashion it can be seen that if decoder lo 33 is latched before the termination of the cycle of the monitored signal indicated by the output of frequency divide by two circuit 25, then the monitored signal cycle is long compared to the reference period and the monitored signal frequency is low. By an arbitrary assignment of polarities the "NOT Q" output of decoder lo circuit 33 causes indicator light 37 to give a low frequency indication in the situation just previously described. The "NOT Q" output of decoder hi 31 and the "Q" output of decoder lo 33 are supplied to NOR circuit 39. By appropriate assignment of polarities these two outputs from decoder hi 31 and decoder lo 33 will both be "zero" only if there is neither a high frequency nor a low frequency condition as previously described. This represents a monitored signal frequency within-tolerance and a "one" signal is provided to relay driver 41 causing the relay to be actuated closing contacts between terminals 43 and 44 to operate external equipment such as a circuit breaker or the like. Relay driver and relay 41 could be provided with additional contacts and additional terminals including normally closed contacts, double throw contacts, etc.

An outside-of-tolerance as indicated by the output from NOR circuit 39 through inverter circuit 30 causes a signal to be supplied to the resistance capacitance timing circuit for the first stage of two-stage timer 27 which effectively places resistors 107 and 115 in parallel and reduces the time constant of that first stage to a very low value. This causes the frequency tolerance to be reduced during an out-of-tolerance condition with the result that some hysteresis is introduced in the system. Thus if there is a borderline condition the circuit will show an out-of-tolerance condition until the monitored signal frequency has made a significant move toward the center frequency so that it will meet the tighter tolerance requirements for a transition from the out-of-tolerance state of the within-tolerance state. This prevents vacillation of the circuit with resultant chatter of the relay contacts.

The double frequency detector circuit 47 is provided for the special purpose of preventing a false low frequency indication when the monitored frequency is about two (or more) times the center frequency. The double frequency detector 47 receives input from the divide by two circuit 25 and the period timer 21 and produces an output to the reset input of decoders 31 and 33 whenever there is a very high frequency condition of about two or more times the center frequency. This prevents decoder hi 31 and decoder lo 33 from indicating anything but an over-frequency condition.

It may be noted in the block diagram of FIG. 1 that the two-stage timer 27 determines a time period difference between the monitored signal cycle period and the reference period which determines a tolerance or acceptance band both above and below the center frequency. The same time difference in period above frequency and below frequency will not produce the exact same number of Hz tolerance when one changes from time period relationships to frequency relationships. A two-stage timer period of 282.5 microseconds produces a low frequency tolerance of one Hz, but the same period produces a high frequency tolerance of 1.03 Hz. The detailed circuit diagram of FIG. 2 has an additional sub-circuit which tends to equalize the high and low frequency tolerances measured in Hz to the point where any difference is negligible.

Figure 2:
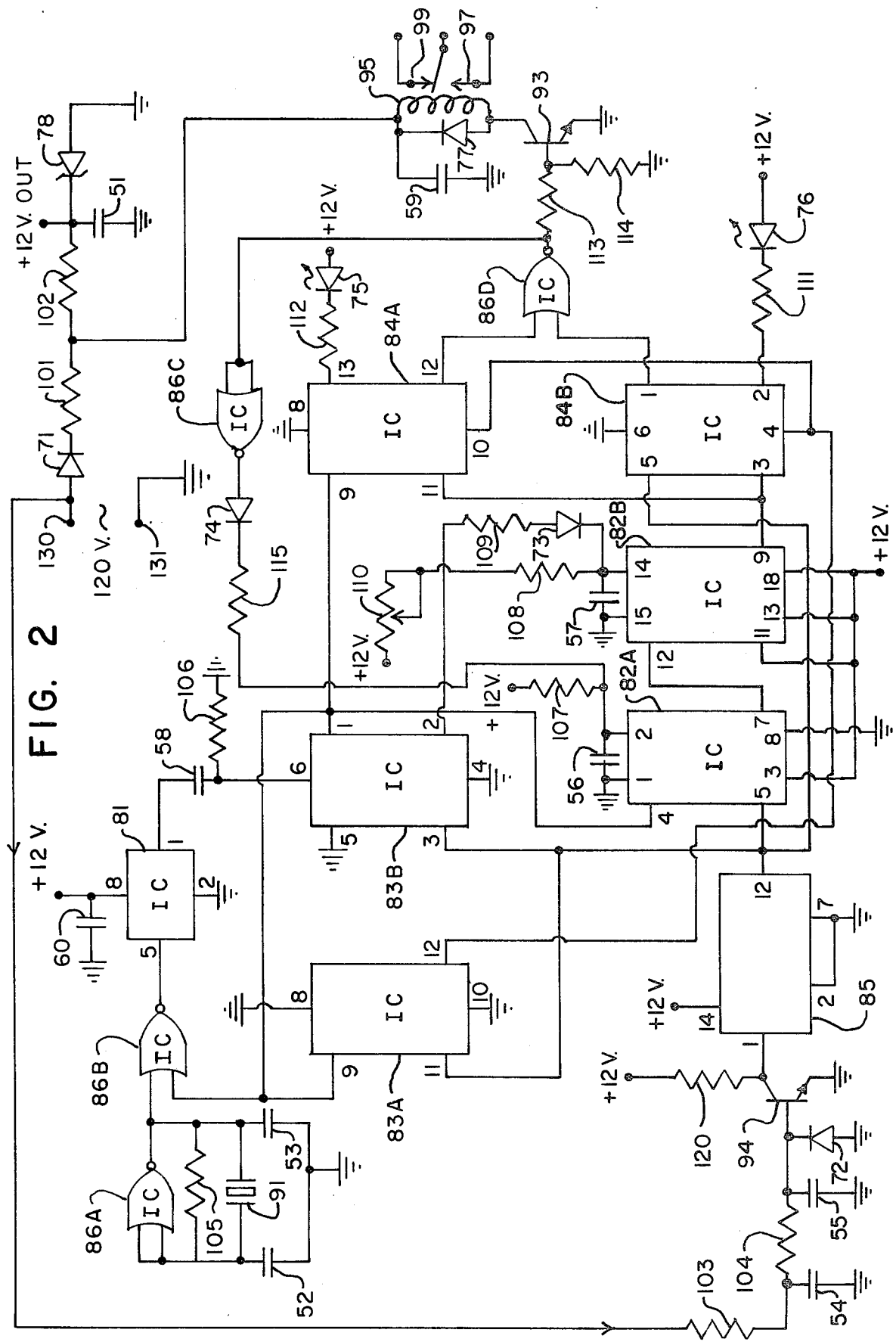
FIG. 2 is a schematic circuit diagram of an electronic circuit embodying the present invention.

Referring now to FIG. 2, a detailed circuit diagram utilizing integrated circuits is shown exemplifying the invention. The frequency monitor circuit is connected to the AC power supply voltage being monitored, normally at a voltage of 120 volts. This voltage is applied to terminals 130 and 131. A +12 volt DC power supply is provided by diode 71, resistor 101, resistor 102, capacitor 51, and zener diode 78. The +12 volt output is available from the junction between capacitor 51 and zener diode 78. Power for a relay coil may be taken from the junction between resistor 101 and resistor 102.

In this case the AC line for the DC power supply is also the AC power being monitored and thus terminal 130 is connected through a low-pass wave shaping filter network consisting of resistors 103, 104, capacitor 54, and capacitor 55. The output of the filter network is connected to the base of transistor 94 which is an NPN transistor used as a clipping amplifier to convert the incoming signal to a square waveform. Diode 72 connected from the base of transistor 94 to ground protects the base emitter junction of transistor 94 from reverse breakdown. Twelve volt DC power is supplied to transistor 94 through collector resistor 120. Integrated Circuit (IC) 85 is connected to receive the square wave output of transistor 94 at pin one. It is a binary divider used to divide the input frequency by two (or alternatively by sixteen). Pins 2 and 7 are connected to ground and pin 12 provides an output square wave with frequency divided by two. Previous mention was made of the fact that higher AC power frequencies may be monitored by causing this divide by two circuit to divide by a higher multiple of two. For example a circuit which would normally monitor a 50 Hz signal can be altered to monitor a 400 Hz signal by changing IC 85 to divide by 16 (output of pin 6). It will be noted that the pin numbers of the ICs in FIG. 2 are noted where important, and further reference will not be made to the pin numbers unless necessary for clarity.

The output of IC 85 is connected to IC 83A and Ic 83B which serve as a double frequency detector and a reference period timer, respectively. IC 83A and 83B are respective halves of a dual type "D" flip-flop.

A stable crystal controlled oscillator circuit includes crystal 91, capacitors 52 and 53, resistor 105, and IC 86A, which is a NOR circuit connected as an amplifier. ICs 86A, 86B, 86C, and 86D may be sections of one IC package such as IC number MC 14001.

IC 86B receives the output of the oscillator circuit from IC 86A and acts as a gate between the oscillator and IC 81 which receives the output of IC 86B. FIG. 2 shows a circuit for monitoring a 60 Hz signal and thus IC 81 is a mask-programmable divider for dividing the output of the oscillator circuit to a 60 Hz output. Capacitor 60 is an external capacitor required for IC 81. The output of IC 81 is passed through a differentiating circuit consisting of capacitor 58 and resistor 106 and supplied as another input to IC 83B, the reference period timer. The output (pin 1) of IC 83B responds to an input from IC 85 and is supplied to IC 86B to turn on IC 81 to count down the 60 Hz reference period, the termination of which is a signal to input pin 6 of IC 83B. The output of IC 83B indicating reference period duration and the output of IC 85 indicating the duration of the monitored frequency one cycle period are both transmitted to IC 82A which is one-half of a dual precision monostable multi-vibrator and forms the first stage of the two-stage timer. The time period for IC 82A basically is set by capacitor 56 and resistor 107 (which under certain conditions is also in parallel with resistor 115). IC 82A is connected so that the first input from either IC 85 or IC 83B will commence its operation. After a prescribed time period an output signal from IC 82A is transmitted to IC 82B (the other half of the monostable multi-vibrator) which acts as the second stage of the two-stage timer and which has a variable time delay. The time delay for IC 82B is primarily determined by capacitor 57, resistor 108 and variable resistor 110. However, in some instances it is very desirable that the tolerance on the high frequency side for the frequency monitor be substantially the same number of Hz or fractions of Hz as the tolerance on the low frequency side. This requires that the delay for IC 82B be slightly different in the two different circumstances. Resistor 109 and diode 73 are used to reduce the pulse width or the delay from IC 82B when the monitored AC frequency is higher than the reference frequency. In this manner any setting of resistor 110 will produce a substantially symmetrical tolerance about the center frequency; that is the high and low band edges for a within-tolerance indication will be very nearly (but not exactly) an equal number of Hz away from the center frequency.

IC 84A and IC 84B are halves of a dual-type "D" flip-flop used to latch the logic state present at the output of IC 83B and IC 85, respectively, when the trailing edge of the pulse from IC 82B occurs indicating the end of the two-stage timer delay. If both the reference period and the monitored frequency period have ended by the end of the two-stage timer delay indicated by the output from IC 82B then, as previously explained, the monitored frequency is within the tolerance set by adjustment of resistor 110. The output of IC 84A at pin 13 is connected through resistor 112 to a light emitting diode 75 which provides a high frequency indication for a low output at pin 13. In a similar fashion IC 84B has pin 2 connected through resistor 111 to light emitting diode 76 which provides a low frequency indication. In the condition just described where both the monitored frequency time period and the reference period have ended when IC 84A and IC 84B are latched there will be no indication at either LED 75 or LED 76. There will, however, be outputs at pin 1 of IC 84B and pin 12 of IC 84A which are connected to the inputs of IC 86D which is a NOR circuit. Its output is connected through resistor 113 to the base of transistor 93 acting as a relay driver. Base resistor 114 for transistor 93 prevents leakage current from turning transistor 93 on. In the within-tolerance condition just described, transistor 93 is turned on to energize relay coil 95 and close normally open contact 97. A normally closed contact 99 is also shown which may be connected to an external terminal of the apparatus if desired. Diode 77 connected in series with relay coil 95 suppresses the transient due to collapsing field in the relay coil; capacitor 59 filters the DC power supplied to coil 95.

When the monitored frequency is not within frequency tolerance one or the other of ICs 84A and 84B will not be supplied with a signal indicating the end of the reference time period (from IC 83B) or indicating the end of the monitored frequency one cycle period (from IC 85) at the time when both IC 84A and IC 84B are latched by an output from IC 82C.

If the reference period signal is not received by IC 84A then LED 75 will light indicating a high frequency out-of-tolerance condition. If IC 84B does not receive the signal indicating the end of the monitored frequency one cycle period then LED 76 will light indicating a low frequency condition.

IC 86C is connected as an inverter and receives the output of IC 86D and transmits the inverse of that signal through diode 74 and resistor 115 to pin 2 of IC 82A. Thus when there is an out-of-tolerance condition resistor 115 is effectively connected in parallel with resistor 107 which shortens the time delay of IC 82A with resulting hysteresis in circuit operation that prevents relay chatter in borderline situations. This is the purpose of introducing IC 82A as a preliminary stage in the two-stage timer and if this feature is not required (or is provided by other means) IC 82A could be omitted.

IC 82A is for the purpose of detecting a nearly double frequency (or greater) monitored frequency condition and preventing false indications that could be produced under those conditions. IC 83A receives an output from IC 83B and also receives an output from IC 85. When the double frequency condition exists IC 83A produces an output (pin 12) which is transmitted to IC 84A and IC 84B to reset both ICs with the result that a high frequency indication is forced and any erroneous low frequency indication is overridden.

It may be noted that one relay and one relay driver are provided in the circuit of FIG. 2 and that either a high frequency or low frequency condition deactivates the relay to open (or close) relay contacts. It should be noted that if one desired separate relays to operate for high frequency or low frequency conditions one would connect the respective relay driver inputs to the outputs of IC 84A and IC 84B directly without the intervention of IC 86D which acts as a logic NOR device.

Figure 3:
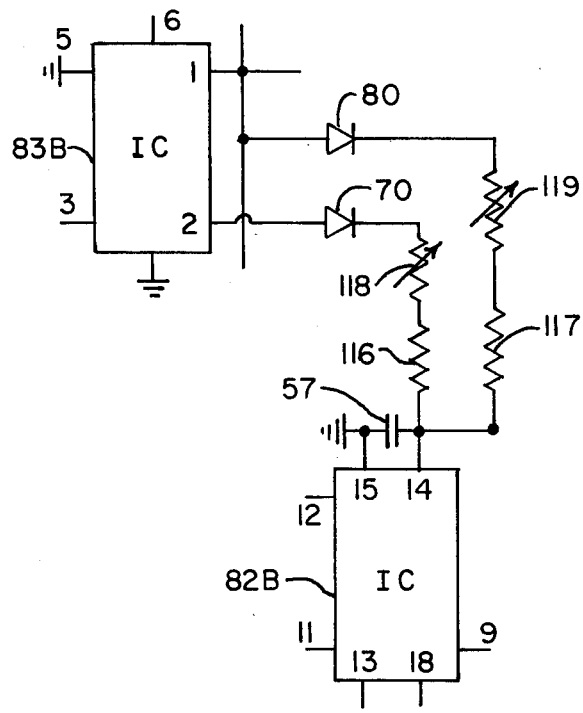
FIG. 3 is a schematic circuit diagram of an alternative sub-circuit to be substituted in the circuit of FIG. 2 to provide independent adjustment of low frequency tolerance and high frequency tolerance.

It is also possible to separate the frequency tolerance adjustment function to provide a separate high frequency tolerance and a separate low frequency tolerance which can be individually adjusted. The circuit of FIG. 3 shows the changes that are made in FIG. 2 in order to provide separate high frequency and low frequency tolerances. Only the connections to IC 82B and 83B are involved. Resistors 108, 109, and 110, together with diode 73 are eliminated and in their place are put a diode 80, variable resistor 119 and resistor 117 connected in series from IC 83B, pin 1 to IC 82B, pin 14; and a second series circuit consisting of diode 70, variable resistor 118, and resistor 116 connected between pin 2 of IC 83B and pin 14 of IC 82B. Variable resistor 118 controls the high frequency tolerance in the arrangement of FIG. 3 and variable resistor 119 controls the low frequency tolerance.

Table I below gives representative values for capacitance and resistance and semiconductor designation numbers for FIG. 2:

TABLE I

| Capacitors | Microfarads or Other |
| --- | --- |
| 51 | 15 |
| 52 | 22 pf |
| 53 | 30 pf |
| 54 | .01 |
| 55 | .01 |
| 56 | .0027 |
| 57 | .0027 |
| 58 | .01 |
| 59 | 10. |
| 60 | .01 |

| Diodes | Designation Number |
| --- | --- |
| 71 | IN4007 |
| 70, 72–74, 80 | IN914 |
| 75 | L.E.D. |
| 76 | L.E.D. |
| 77 | IN4007 |
| 78 | 12V., 3W. |

| I.C.'s | Designation Number |
| --- | --- |
| 81 | MM5369-AA/N(60 Hz) |
|  | MM5369-EYR/N(50 Hz) |
| 82 | MC14538B |
| 83–84 | MC4013 |
| 85 | MC4024 |
| 86A–86D | MC14001 |

| Transistors | Designation Number |
| --- | --- |
| 93 | MPS-A42 |
| 94 | 2N5827 |

| Resistors | K-OHMS or Other |
| --- | --- |
| 101 | 0.82 |
| 102 | 13. |
| 103–104 | 100. |
| 105 | 20 Meg. |
| 106 | 1 Meg. |
| 107 | .15 |
| 108 | 33 |
| 109 | 3.9 Meg. |
| 110 | 470. |
| 111–112 | 2.2 |
| 113 | 10. |
| 114 | 1. |
| 115 | 4.7 |
| 116–117 | 33. |
| 118–119 | 470. |
| 120 | 22. |

From the foregoing description and explanation it will be seen that the frequency monitor apparatus according to the invention provides a monitor circuit having numerous desirable features for monitoring AC power frequencies or higher frequencies with great reliability and accuracy. In addition to the particular variations and modifications to the circuit which are shown or suggested, it will be apparent to those skilled in the art that numerous other modifications and variations may be made to the circuit within the scope of the invention; accordingly the scope of the invention is not to be considered to be limited to the particular embodiments and variations shown or suggested above but is to be determined by reference to the appended claims.

What is claimed is:

1. Frequency monitor apparatus for detecting and indicating departures of a monitored signal frequency from a reference frequency by greater than a preset tolerance comprising
   first means for generating a first timing pulse having a period equal to a multiple not less than two of one-half cycle of a reference frequency,
   second means for generating a second timing pulse having a period equal to a multiple not less than two of one-half cycle of a monitored signal,
   said first means being connected to start in synchronism with said second means,
   third means responsive to the end of the period of either said first means or second means to produce a delay pulse substantially shorter than either of said timing pulse periods, and
   fourth means for detecting the failure of either said first timing pulse period or said second timing pulse period to end at the termination of said delay pulse.

2. Apparatus as recited in claim 1 wherein the multiple of one-half cycle in the first means and in the second means is two.

3. Apparatus as recited in claim 1 wherein the multiple of one-half cycle in the second means is an even multiple greater than two.

4. Apparatus as recited in claim 1 further including means for detecting and indicating the failure of only said second timing pulse period to end at the termination of said delay pulse.

5. Apparatus as recited in claim 1 wherein said delay pulse is a pulse of adjustable length.

6. Frequency monitor apparatus for detecting departures of a monitored signal frequency from a reference frequency by greater than a preset tolerance comprising,
   first means for generating a first timing pulse having a period equal to a multiple not less than two of one-half cycle of a reference frequency,
   second means for generating a second timing pulse having a period equal to a multiple not less than of one-half cycle of a monitored signal,
   third means for starting said first means and second means in synchronism,
   fourth means responsive to the end of the period of either said first means or second means to produce a delay pulse having a period shorter than either of said timing pulse periods, and
   fifth means for detecting the failure of either said first timing pulse period or said second timing pulse period to end before the termination of said delay pulse.

7. Apparatus as recited in claim 6 wherein the multiple of one-half cycle in the first means and in the second means is two.

8. Apparatus as recited in claim 6 wherein the multiple of one-half cycle in the second means is a multiple greater than two.

9. Frequency monitor apparatus for detecting departures of a monitored signal frequency from a reference frequency by greater than a preset tolerance comprising,
   first means for generating a first timing pulse having a period equal to a multiple not less than two of one-half cycle of a reference frequency,
   second means for generating a second timing pulse having a period equal to a multiple not less than two of one-half cycle of a monitored signal,
   third means for starting said first meand and second means in synchronism,
   fourth means responsive to the end of the period of either said first means or second means to produce a variable length delay pulse having a period shorter than either of said timing pulse periods,
   fifth means for detecting an out of tolerance condition by the failure of either said first timing pulse period or said second timing pulse period to end before the termination of said delay pulse, and
   a manual adjustment for adjusting the length of said delay pulse and thereby vary the frequency tolerance of said monitor apparatus.

10. Apparatus as recited in claim 9 wherein the multiple of one-half cycle in the first means is two.

11. Apparatus as recited in claim 10 wherein the multiple of one-half cycle in the second means is a multiple greater than two.

12. Frequency monitor apparatus for detecting departures of a monitored signal frequency from a reference frequency by greater than a preset tolerance comprising
    first means for generating a first timing pulse having a period equal to a multiple not less than two of one-half cycle of a reference frequency,
    second means for generating a second timing pulse having a period equal to a multiple not less than two of one-half cycle of a monitored signal,
    third means for starting said first means and second means in synchronism,
    fourth means responsive to the end of the period of either said first means or second means to produce a variable length delay pulse having a period shorter than either of said timing pulse periods,
    fifth means for detecting an out of tolerance condition by the failure of either said first timing pulse period or said second timing pulse period to end before the termination of said delay pulse,
    a manual adjustment for adjusting the length of said delay pulse and thereby vary the frequency tolerance of said monitor apparatus and,
    sixth means responsive to said fifth means for slightly shortening the length of said delay pulse while said apparatus detects an out-of-tolerance condition.

13. Apparatus as recited in claim 12 further including means for detecting and indicating the failure of said second timing pulse period to end before the termination of said delay pulse.

14. Apparatus as recited in claim 12 wherein the multiple of one-half cycle in the first means is two.

15. Apparatus as recited in claim 14 wherein the multiple of one-half cycle in the second means is greater than two.

* * * * *